United States Patent
Chen et al.

(10) Patent No.: US 11,839,027 B2
(45) Date of Patent: Dec. 5, 2023

(54) ELECTRONIC DEVICE WITH CONNECTOR STRUCTURE

(71) Applicant: Wistron NeWeb Corp., Hsinchu (TW)

(72) Inventors: Yan-Da Chen, Hsinchu (TW); Shih-Hao Ou, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 442 days.

(21) Appl. No.: 17/302,083

(22) Filed: Apr. 23, 2021

(65) Prior Publication Data

US 2022/0015235 A1    Jan. 13, 2022

(30) Foreign Application Priority Data

Jul. 8, 2020   (TW) .................... 109122967

(51) Int. Cl.
| | |
|---|---|
| *H05K 1/14* | (2006.01) |
| *H05K 1/18* | (2006.01) |
| *H05K 7/14* | (2006.01) |
| *H01R 12/71* | (2011.01) |
| *H01R 12/70* | (2011.01) |

(52) U.S. Cl.
CPC ......... *H05K 1/144* (2013.01); *H01R 12/7005* (2013.01); *H01R 12/716* (2013.01); *H05K 1/18* (2013.01); *H05K 7/1417* (2013.01); *H05K 2201/10371* (2013.01); *H05K 2201/2018* (2013.01)

(58) Field of Classification Search
CPC ....... H05K 1/0216; H05K 2201/10189; H05K 1/144; H05K 1/18; H05K 7/1417; H05K 2201/10371; H05K 2201/2018; H01R 13/6582; H01R 13/6594; H01R 12/73; H01R 12/7005; H01R 12/716
See application file for complete search history.

(56) References Cited

U.S. PATENT DOCUMENTS

| | | | |
|---|---|---|---|
| 7,729,131 B2 | 6/2010 | Wang et al. | |
| 2021/0006017 A1 | 1/2021 | Chen | |

FOREIGN PATENT DOCUMENTS

| | | | | |
|---|---|---|---|---|
| KR | 20200001157 | * | 6/2020 | ............ H05K 3/366 |
| TW | 200843617 A | | 11/2008 | |
| TW | M581306 U | | 7/2019 | |
| TW | M584999 U | | 10/2019 | |

* cited by examiner

*Primary Examiner* — Anthony Q Edwards
*Assistant Examiner* — Hung Q Dang
(74) *Attorney, Agent, or Firm* — McClure, Qualey & Rodack, LLP (57) ABSTRACT

An electronic device with a connector structure is provided. The electronic device includes a first circuit board, a first connector, a first shielding cover, a second circuit board, a second connector, and a second shielding cover. The first connector is disposed on the first circuit board. The first shielding cover is disposed on the first circuit board and surrounds the first connector. The second connector is disposed on the second circuit board, wherein the second connector is connected to the first connector. The second shielding cover is disposed on the second circuit board and surrounds the second connector, wherein the first shielding cover is electrically connected to the second shielding cover.

14 Claims, 5 Drawing Sheets

ELECTRONIC DEVICE WITH CONNECTOR STRUCTURE

CROSS REFERENCE TO RELATED APPLICATIONS

This Application claims priority of Taiwan Patent Application No. 109122967, filed on Jul. 8, 2020, the en tirety of which is incorporated by reference herein.

BACKGROUND OF THE INVENTION

Field of the Invention

The present invention relates to an electronic device, and in particular to an electronic device with a connector structure.

Description of the Related Art

In a conventional electronic device (such as a wireless router), two parallel circuit boards may be coupled by a connector structure. The connector structure generates electromagnetic radiation and radio frequency interference, which can influence the transmissions of the electronic device. Conventionally, to reduce this interference, copper foil is attached to the connector structure. However, the process of attaching the copper foil is difficult, and increases the cost of assembly.

BRIEF SUMMARY OF THE INVENTION

Embodiments of the invention are provided to address the aforementioned difficulty.

In one embodiment, an electronic device with a connector structure is provided. The electronic device includes a first circuit board, a first connector, a first shielding cover, a second circuit board, a second connector and a second shielding cover. The first connector is disposed on the first circuit board. The first shielding cover is disposed on the first circuit board and surrounds the first connector. The second connector is disposed on the second circuit board, wherein the second connector is connected to the first connector. The second shielding cover is disposed on the second circuit board and surrounds the second connector, wherein the first shielding cover is electrically connected to the second shielding cover.

In one embodiment, the first shielding cover comprises a first surrounding wall and a first contact structure, the first contact structure is connected to the first surrounding wall, the first surrounding wall surrounds the first connector, the second shielding cover comprises a second surrounding wall and a second contact structure, the second contact structure is connected to the second surrounding wall, the second surrounding wall surrounds the second connector, and the first contact structure corresponds to the second contact structure.

In one embodiment, the electronic device further comprises a conductive buffer material, the conductive buffer material is sandwiched between the first contact structure and the second contact structure, and the first shielding cover is electrically connected to the second shielding cover via the conductive buffer material.

In one embodiment, the first contact structure comprises a first planar portion, the second contact structure comprises a second planar portion, the first planar portion faces the second planar portion, the conductive buffer material contacts the first planar portion and the second planar portion at the same time, and the conductive buffer material is sandwiched between the first planar portion and the second planar portion.

In one embodiment, the first contact structure comprises a planar portion, the second contact structure comprises a plurality of elastic units, and the elastic units elastically abut the planar portion.

In one embodiment, the elastic unit comprises an elastic arm, a fixing end of the elastic arm is connected to the second contact structure, and a free end of the elastic arm abuts the first contact structure.

In one embodiment, the first contact structure comprises a first planar portion and at least one first bent portion. The first bent portion is connected to the first planar portion. The first bent portion and the first planar portion are not coplanar. The first bent portion abuts the second contact structure. The first bent portion is bent toward the second shielding cover.

In one embodiment, the second contact structure comprises at least one abutting arm, the abutting arm extends toward the second connector, and the abutting arm abuts the first bent portion.

In one embodiment, the abutting arm comprises a protrusion, and the protrusion abuts the first bent portion.

In one embodiment, the first contact structure defines a first opening, the first opening corresponds to the first connector, the first shielding cover further comprises a first picking stage, the first picking stage is integrally formed on the first contact structure and coplanar with the first contact structure, and the first picking stage is located outside of the first opening.

In one embodiment, the first surrounding wall comprises a first side wall section, a second side wall section, a third side wall section and an extending section, the first side wall section and the second side wall section are integrally formed on the first contact structure, a first notch is formed between the first side wall section and the second side wall section, the first picking stage corresponds to the first notch, the third side wall section is integrally formed on the first contact structure, the extending section is integrally formed on the third side wall section, and the extending section covers the first notch.

In one embodiment, the third side wall section is perpendicular to the first side wall section, section, the third side wall section is perpendicular to the second side wall section, the extending section partially overlaps the first side wall section, the extending section partially overlaps the second side wall section, the first side wall section is located on one side of the extending section, and the second side wall section is located on the other side of the extending section.

In one embodiment, the extending section comprises an extending portion, a bent portion and an abutting portion, the extending portion partially overlaps the first side wall section, the bent portion is located between the extending portion and the abutting portion, the abutting portion abuts the second side wall section, and the extending portion covers at leas a portion of the first notch.

In one embodiment, the first circuit board comprises a first ground layer, the second circuit board comprises a second ground layer, the first shielding cover is connected to the first ground layer, and the second shielding cover is connected to the second ground layer.

In one embodiment of the invention, the first shielding cover is electrically connected to the second shielding cover by the conductive buffer material. The conductive buffer material sufficiently covers the gap between the first shielding cover and the second shielding cover, and provides shielding effect. In one embodiment, the first shielding cover is coupled to the first ground layer, and the second shielding cover is coupled to the second ground layer to provide improved shielding effect.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
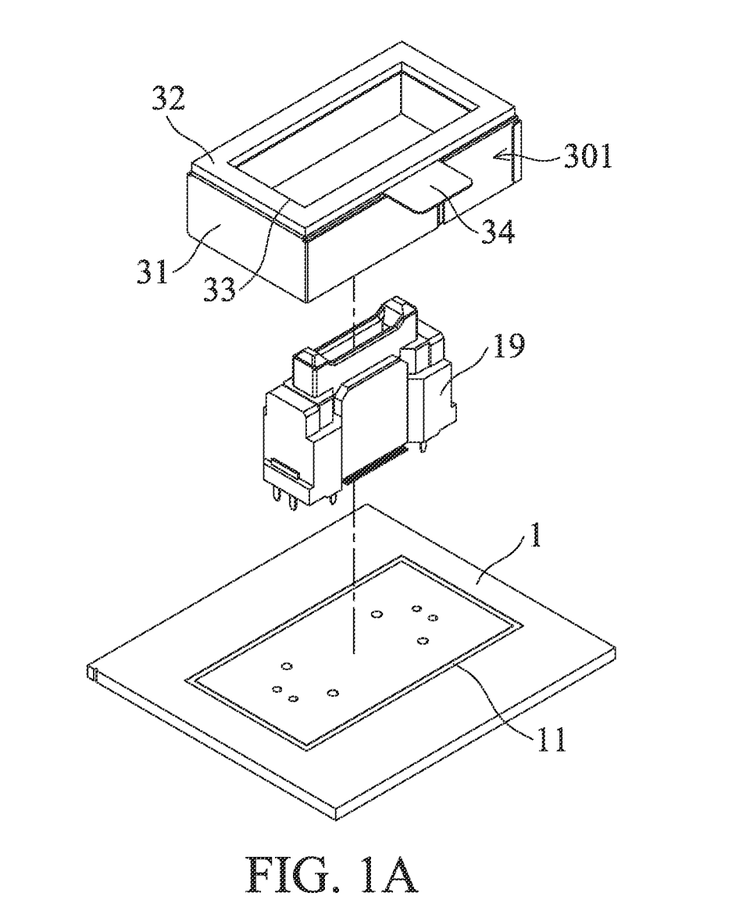
FIG. 1A shows a first circuit board, a first connector and a first shielding cover of a first embodiment of the invention.
Figure 1B:
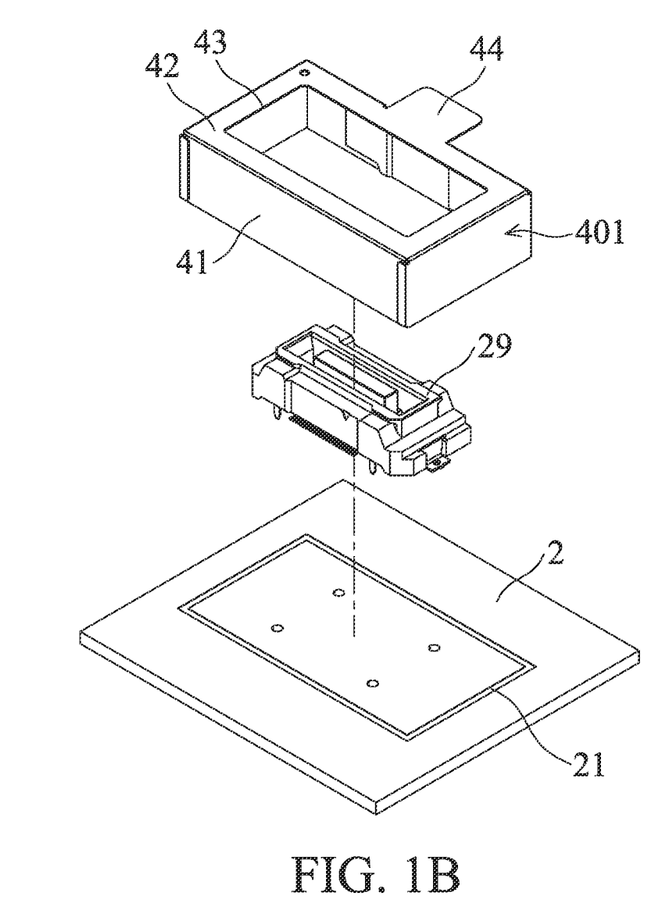
FIG. 1B shows a second circuit board, a second connector and a second shielding cover of the first embodiment of the invention.
Figure 1C:
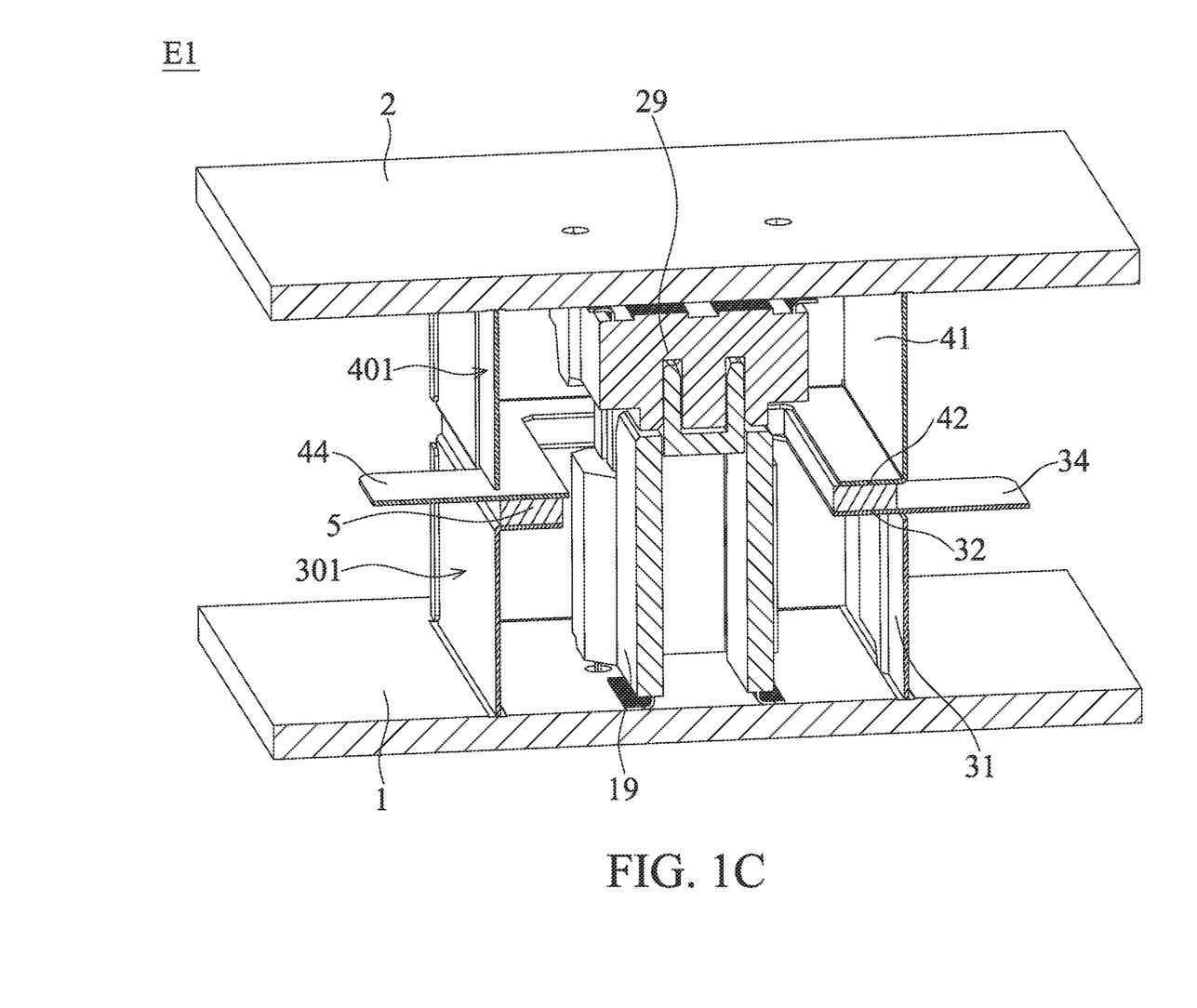
FIG. 1C is a cross sectional view of an electronic device with a connector structure of the first embodiment of the invention.

FIG. 1A shows a first circuit board, a first connector and a first shielding cover of a first embodiment of the invention. FIG. 1B shows a second circuit board, a second connector and a second shielding cover of the first embodiment of the invention. FIG. 1C is a cross sectional view of an electronic device with a connector structure of the first embodiment of the invention. With reference to FIGS. 1A, 1B and 1C, in one embodiment, the electronic device E1 includes a first circuit board 1, a first connector 19, a first shielding cover 301, a second circuit board 2, a second connector 29 and a second shielding cover 401. The first connector 19 is disposed on the first circuit board 1. The first shielding cover 301 is disposed on the first circuit board 1 and surrounding the first connector 19. The second connector 29 is disposed on the second circuit board 2, wherein the second connector 29 is connected to the first connector 19. The second shielding cover 401 is disposed on the second circuit board 2 and surrounding the second connector 29, wherein the first shielding cover 301 is electrically connected to the second shielding cover 401.

With reference to FIGS. 1A, 1B and 1C, in one embodiment, the first shielding cover 301 comprises a first surrounding wall 31 and a first contact structure 32. The first contact structure 32 is connected to the first surrounding wall 31. The first surrounding wall 31 surrounds the first connector 19. The second shielding cover 401 comprises a second surrounding wall 41 and a second contact structure 42. The second contact structure 42 is connected to the second surrounding wall 41. The second surrounding wall 41 surrounds the second connector 29. The first contact structure 32 corresponds to the second contact structure 42. In this embodiment, when the first circuit board is assembled with second circuit board, there is increased corresponding area between the first contact structure 32 and the second contact structure 42. The manufacturing tolerance of the first contact structure 32 and the second contact structure 42 can be compensated, and the first circuit board can be easily combined with second circuit board.

With reference to FIG. 1C, in one embodiment, the electronic device E1 further comprises a conductive buffer material 5. The conductive buffer material 5 is sandwiched between the first contact structure 32 and the second contact structure 42. The first shielding cover 301 is electrically connected to the second shielding cover 401 via the conductive buffer material 5.

With reference to FIGS. 1A, 1B and 1C, in one embodiment, the first contact structure 32 comprises a first planar portion (as shown in FIG. 1A, the first contact structure 32 is planar). The second contact structure 42 comprises a second planar portion (as shown in FIG. 1B, the second contact structure 42 is planar). The first planar portion (32) faces the second planar portion (42). The conductive buffer material 5 contacts the first planar portion (32) and the second planar portion (42) at the same time. The conductive buffer material 5 is sandwiched between the first planar portion (32) and the second planar portion (42). In this embodiment, the conductive buffer material 5 absorbs the manufacturing tolerance of the first contact structure 32 and the second contact structure 42, and provides improved shielding effect.

With reference to FIGS. 1A and 1C, in one embodiment, the first contact structure 32 defines a first opening 33. The first opening 33 corresponds to the first connector 19. The first shielding cover 301 further comprises a first picking stage 34. The first picking stage 34 is integrally formed on the first contact structure 32 and coplanar with the first contact structure 32. The first picking stage 34 is located outside of the first opening 33. Similarly, with reference to FIGS. 1B and 1C, in one embodiment, the second contact structure 42 defines a second opening 43. The second opening 43 corresponds to the second connector 29. The second shielding cover 401 further comprises a second picking stage 44. The second picking stage 44 is integrally formed on the second contact structure 42 and coplanar with the second contact structure 42. The second picking stage 44 is located outside of the second opening 43. In this embodiment, the first picking stage 34 is located outside of the first opening 33, and the space of the first circuit board 1 occupied by the first shielding cover 301 can be decreased. The second picking stage 44 is located outside of the second opening 43, and the space of the second circuit board 2 occupied by the second shielding cover 401 can be decreased.

In one embodiment of the invention, the structure of the first shielding cover 301 can be the same with the structure of the second shielding cover 401. The mold cost of shielding cover can be decreased. However, the disclosure is not meant to restrict the invention. The structure of the first shielding cover 301 can also be different from the structure of the second shielding cover 401.

Figure 2A:
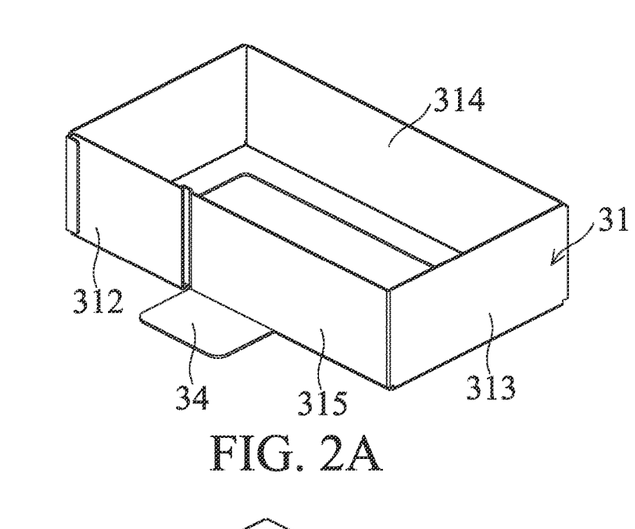
FIG. 2A shows the details of the first shielding cover of the embodiment of the invention.
Figure 2B:
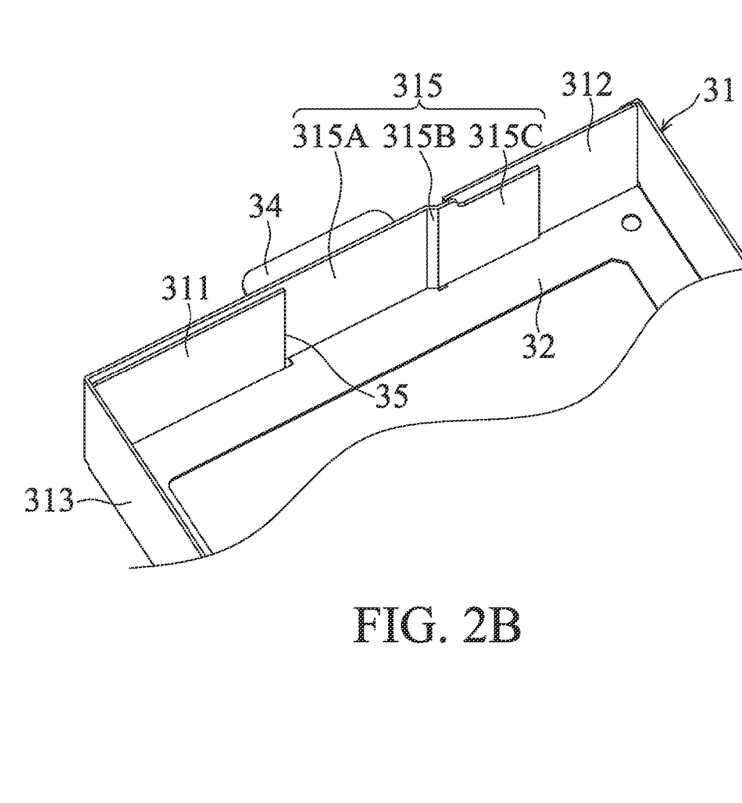
FIG. 2B shows the details of the first shielding cover of the embodiment of the invention in another view angle.

The details of the shielding cover is described below, wherein the first shielding cover is provided as an example, and the description of the second shielding cover is omitted. FIGS. 2A and 2B show the details of the first shielding cover of the embodiment of the invention. With reference to FIGS. 2A and 2B, in one embodiment, the first surrounding wall 31 comprises a first side wall section 311, a second side wall section 312, a third side wall section 313 and an extending section 315. The first side wall section 311 and the second side wall section 312 are integrally formed on the first contact structure 32. A first notch 35 is formed between the first side wall section 311 and the second side wall section 312. The first picking stage 34 corresponds to the first notch 35. The third side wall section 313 is integrally formed on the first contact structure 32. The extending section 315 is integrally formed on the third side wall section 313. The extending section 315 covers the first notch 35.

With reference to FIGS. 2A and 2B, in one embodiment, the third side wall section 313 is perpendicular to the first side wall section 311. The third side wall section 313 is perpendicular to the second side wall section 312 (in one embodiment, the first side wall section 311 and the second side wall section 312 are coplanar). The extending section 315 partially overlaps the first side wall section 311. The extending section 315 partially overlaps the second side wall section 312. The first side wall section 311 is located on one side of the extending section 315. The second side wall section 312 is located on the other side of the extending section 315.

With reference to FIGS. 2A and 2B, in one embodiment, the extending section 315 comprises an extending portion 315A, a bent portion 315B and an abutting portion 315C. The extending portion 315A partially overlaps the first side wall section 311. The bent portion 315B is located between the extending portion 315A and the abutting portion 315C. The abutting portion 315C abuts the second side wall section 312, and the extending portion 315A covers at least a portion of the first notch 35.

Figure 2C:
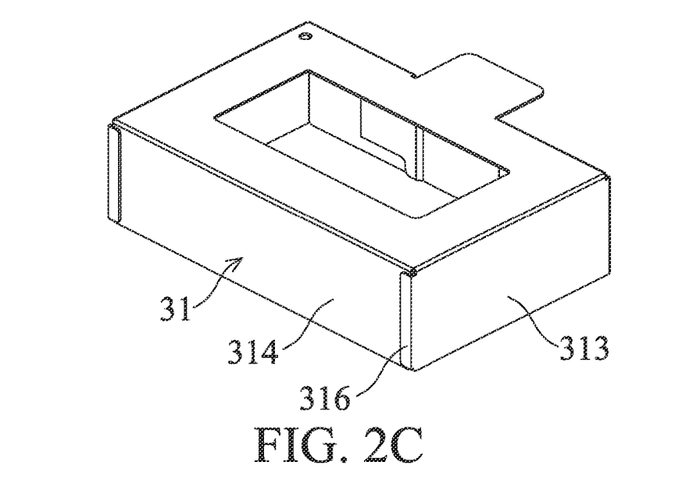
FIG. 2C shows the details of the first shielding cover of the embodiment of the invention in further another view angle.

FIG. 2C shows the details of the first shielding cover of the embodiment of the invention in another view angle. With reference to FIG. 2C, the first surrounding wall 31 comprises a fourth side wall section 314. The third side wall section 313 is perpendicular to the fourth side wall section 314. A bent edge 316 is integrally formed on the third side wall section 313. The bent edge 316 covers the gap between the fourth side wall section 314 and the third side wall section 313 to provide shielding effect. In another embodiment, the bent edge 316 can be omitted. The fourth side wall section 314 can be tightly adjacent to the third side wall section 313. The disclosure is not meant to restrict the invention.

With reference to FIGS. 1A and 1B, in one embodiment, the first circuit board 1 comprises a first ground layer 11. The second circuit board 2 comprises a second ground layer 21.

The first shielding cover 301 is connected to the first ground layer 11. The second shielding cover 401 is connected to the second ground layer 21.

In the first embodiment of the invention, the first shielding cover 301 is electrically connected to the second shielding cover 401 by the conductive buffer material 5. The conductive buffer material 5 sufficiently covers the gap between the first shielding cover 301 and the second shielding cover 401, and provides shielding effect. In one embodiment, the first shielding cover 301 is coupled to the first ground layer 11, and the second shielding cover 401 is coupled to the second ground layer 21 to provide improved shielding effect.

Figure 3A:
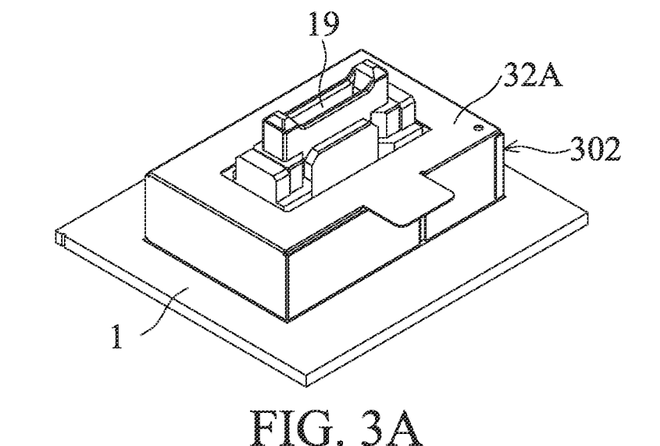
FIG. 3A shows a first circuit board, a first connector and a first shielding cover of a second embodiment of the invention.
Figure 3B:
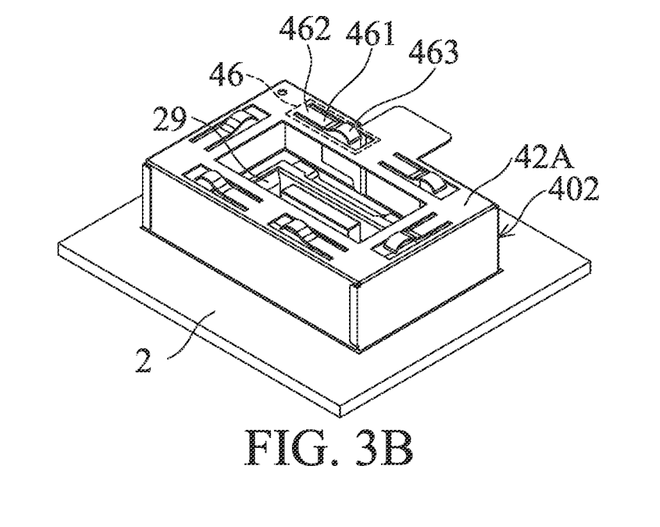
FIG. 3B shows a second circuit board, a second connector and a second shielding cover of the second embodiment of the invention.
Figure 3C:
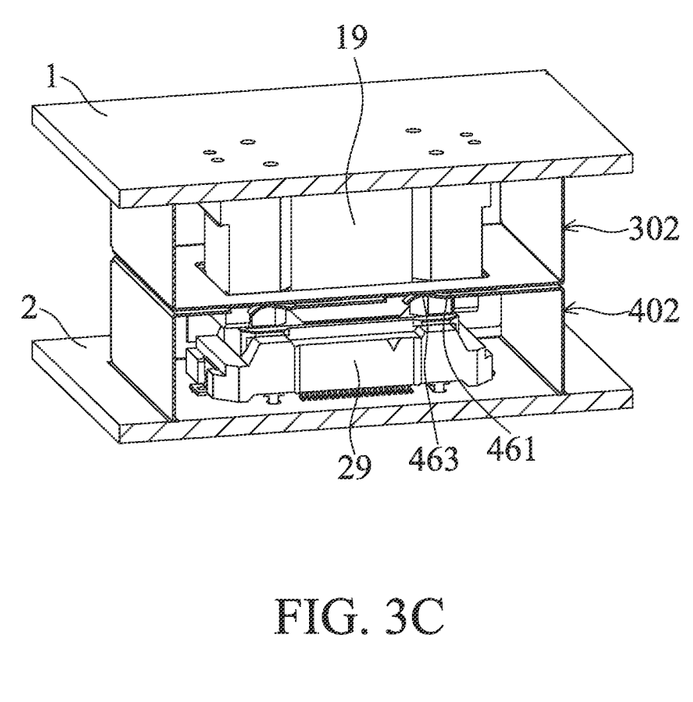
FIG. 3C is a cross sectional view of an electronic device with a connector structure of the second embodiment of the invention.

FIG. 3A shows a first circuit board, a first connector and a first shielding cover of a second embodiment of the invention. FIG. 3B shows a second circuit board, a second connector and a second shielding cover of the second embodiment of the invention. FIG. 3C is a cross sectional view of an electronic device with a connector structure of the second embodiment of the invention. With reference to FIGS. 3A, 3B and 3C, in the second embodiment of the invention, the first contact structure 32A of the first shielding cover 302 comprises a planar portion (32A). The second contact structure 42A of the second shielding cover 402 comprises a plurality of elastic units 46. The elastic units 46 elastically abut the planar portion (32A).

With reference to FIGS. 3A, 3B and 3C, in one embodiment, the elastic unit 46 comprises an elastic arm 461. A fixing end 462 of the elastic arm 461 is connected to the second contact structure 42A. A free end 463 of the elastic arm 461 abuts the first contact structure 32A.

In the second embodiment of the invention, the first shielding cover 302 is electrically connected to the second shielding cover 402 by the elastic unit 46 to provide a shielding effect. Similarly, in one embodiment, the first shielding cover 302 is coupled to the first ground layer, and the second shielding cover 402 is coupled to the second ground layer to provide improved shielding effect.

Figure 4A:
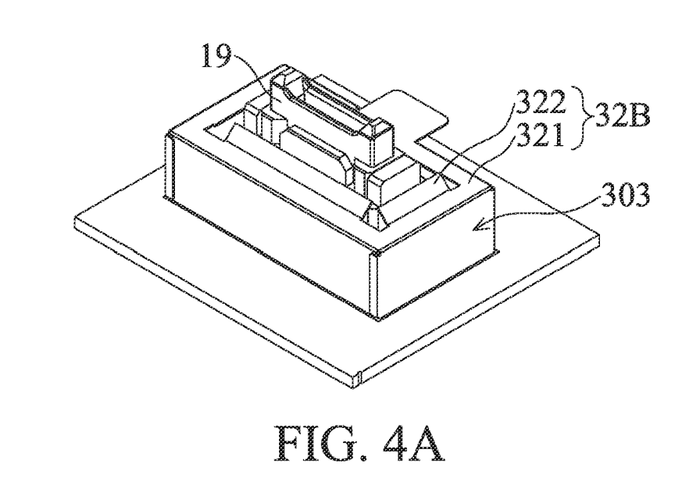
FIG. 4A shows a first circuit hoard, a first connector and a first shielding cover of a third embodiment of the invention.
Figure 4B:
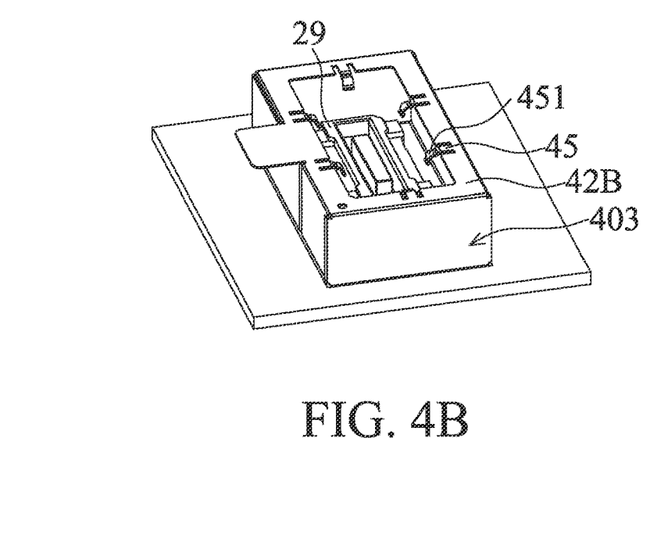
FIG. 4B shows a second circuit board, a second connector and a second shielding cover of the third embodiment of the invention.
Figure 4C:
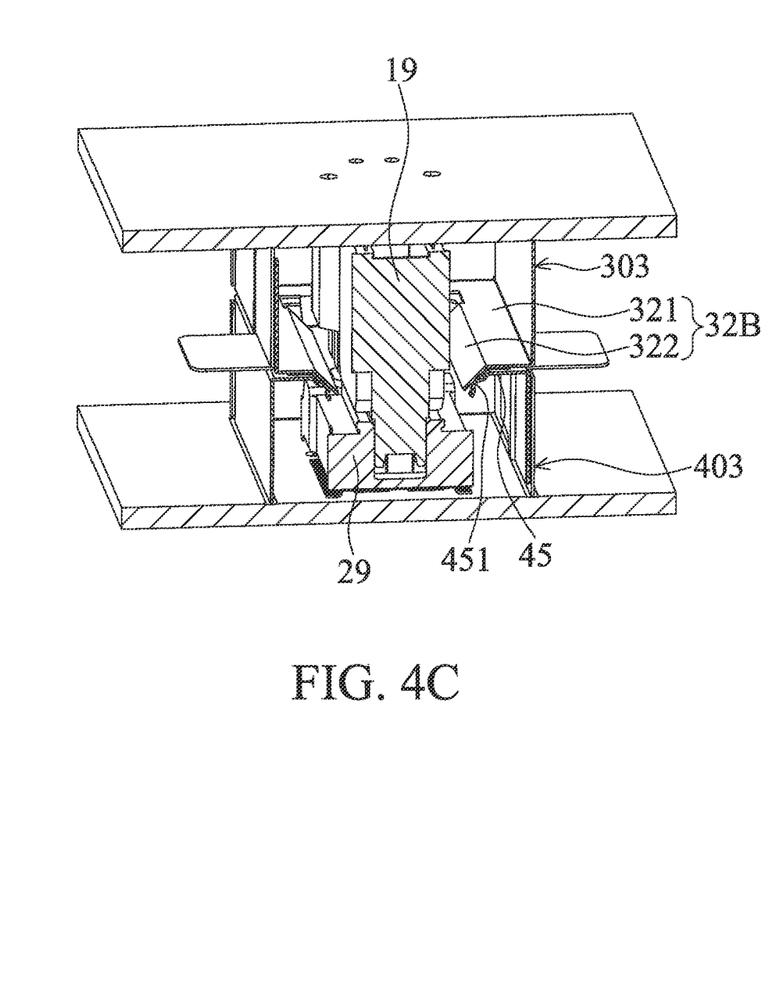
FIG. 4C is a cross sectional view of an electronic device with a connector structure of the third embodiment of the invention.

FIG. 4A shows a first circuit board, a first connector and a first shielding cover of a third embodiment of the invention. FIG. 4B shows a second circuit board, a second connector and a second shielding cover of the third embodiment of the invention. FIG. 4C is a cross sectional view of an electronic device with a connector structure of the third embodiment of the invention. With reference to FIGS. 4A, 4B and 4C, in the third embodiment of the invention, the first contact structure 32B of the first shielding cover 303 comprises a first planar portion 321 and at least one first bent portion 322. The first bent portion 322 is connected to the first planar portion 321. The first bent portion 322 and the first planar portion 321 are not coplanar. The first bent portion 322 abuts the second contact structure 42B of the second shielding cover 403.

With reference to FIGS. 4A, 4B and 4C, in one embodiment, the first bent portion 322 is bent toward the second shielding cover 403.

With reference to FIGS. 4A, 4B and 4C, in one embodiment, the second contact structure 42B comprises at least one abutting arm 45. The abutting arm 45 extends toward the second connector 29. The abutting arm 45 abuts the first bent portion 322.

With reference to FIGS. 4A, 4B and 4C, in one embodiment, the abutting arm 45 comprises a protrusion 451, and the protrusion 451 abuts the first bent portion 322.

In the third embodiment of the invention, the first bent portion 322 covers the gap between the first shielding cover 303 and the second shielding cover 403, and provides shielding effect. The first bent portion 322 abuts the second contact structure 42B of the second shielding cover 403, and the first shielding cover 303 is therefore electrically connected to the second shielding cover 403. In one embodiment, the abutting arm 45 of the second contact structure 42B abuts the first bent portion 322, and the first shielding cover 303 is thus electrically connected to the second shielding cover 403. However, the disclosure is not meant to restrict the invention. The first bent portion 322 can be electrically connected to the second contact structure 42B by other means. Similarly, in one embodiment, the first shielding cover 303 is coupled to the first ground layer, and the second shielding cover 403 is coupled to the second ground layer to provide improved shielding effect.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with a connector structure, comprising:
   a first circuit board;
   a first connector, disposed on the first circuit board;
   a first shielding cover, disposed on the first circuit board and surrounding the first connector;
   a second circuit board;
   a second connector, disposed on the second circuit board, wherein the second connector is connected to the first connector;
   a second shielding cover, disposed on the second circuit board and surrounding the second connector, wherein the first shielding cover is electrically connected to the second shielding cover, wherein the first shielding cover comprises a first surrounding wall and a first contact structure, the first contact structure is connected to the first surrounding wall, the first surrounding wall surrounds the first connector, the second shielding cover comprises a second surrounding wall and a second contact structure, the second contact structure is connected to the second surrounding wall, the second surrounding wall surrounds the second connector, and the first contact structure corresponds to the second contact structure; and
   a conductive buffer material, the conductive buffer material is sandwiched between the first contact structure and the second contact structure, and the first shielding cover is electrically connected to the second shielding cover via the conductive buffer material.

2. The electronic device as claimed in claim 1, wherein the first contact structure comprises a first planar portion, the second contact structure comprises a second planar portion, the first planar portion faces the second planar portion, the conductive buffer material contacts the first planar portion and the second planar portion at the same time, and the conductive buffer material is sandwiched between the first planar portion and the second planar portion.

3. The electronic device as claimed in claim 1, wherein the first contact structure comprises a planar portion, the second contact structure comprises a plurality of elastic units, and the elastic units elastically abut the planar portion.

4. The electronic device as claimed in claim 3, wherein the elastic unit comprises an elastic arm, a fixing end of the elastic arm is connected to the second contact structure, and a free end of the elastic arm abuts the first contact structure.

5. The electronic device as claimed in claim 1, wherein the first contact structure comprises a first planar portion and at least one first bent portion, the first bent portion is connected to the first planar portion, the first bent portion and the first planar portion are not coplanar, the first bent portion abuts the second contact structure, and the first bent portion is bent toward the second shielding cover.

6. The electronic device as claimed in claim 5, wherein the second contact structure comprises at least one abutting arm, the abutting arm extends toward the second connector, and the abutting arm abuts the first bent portion.

7. The electronic device as claimed in claim 6, wherein the abutting arm comprises a protrusion, and the protrusion abuts the first bent portion.

8. The electronic device as claimed in claim 1, wherein the first contact structure defines a first opening, the first opening corresponds to the first connector, the first shielding cover further comprises a first picking stage, the first picking stage is integrally formed on the first contact structure and coplanar with the first contact structure, and the first picking stage is located outside of the first opening.

9. The electronic device as claimed in claim 8, wherein the first surrounding wall comprises a first side wall section, a second side wall section, a third side wall section and an extending section, the first side wall section and the second side wall section are integrally formed on the first contact structure, a first notch is formed between the first side wall section and the second side wall section, the first picking stage corresponds to the first notch, the third side wall section is integrally formed on the first contact structure, the extending section is integrally formed on the third side wall section, and the extending section covers the first notch.

10. The electronic device as claimed in claim 9, wherein the third side wall section is perpendicular to the first side wall section, the third side wall section is perpendicular to the second side wall section, the extending section partially overlaps the first side wall section, the extending section partially overlaps the second side wall section, the first side wall section is located on one side of the extending section, and the second side wall section is located on the other side of the extending section.

11. The electronic device as claimed in claim 10, wherein the extending section comprises an extending portion, a bent portion and an abutting portion, the extending portion partially overlaps the first side wall section, the bent portion is located between the extending portion and the abutting portion, the abutting portion abuts the second side wall section, and the extending portion covers at least a portion of the first notch.

12. The electronic device as claimed in claim 1, wherein the first circuit board comprises a first ground layer, the second circuit board comprises a second ground layer, the first shielding cover is connected to the first ground layer, and the second shielding cover is connected to the second ground layer.

13. An electronic device with a connector structure, comprising:

a first circuit board;
a first connector, disposed on the first circuit board;
a first shielding cover, disposed on the first circuit board and surrounding the first connector;
a second circuit board;
a second connector, disposed on the second circuit board, wherein the second connector is connected to the first connector; and
a second shielding cover, disposed on the second circuit board and surrounding the second connector, wherein the first shielding cover is electrically connected to the second shielding cover,
wherein the first shielding cover comprises a first surrounding wall and a first contact structure, the first contact structure is connected to the first surrounding wall, the first surrounding wall surrounds the first connector, the second shielding cover comprises a second surrounding wall and a second contact structure, the second contact structure is connected to the second surrounding wall, the second surrounding wall surrounds the second connector, and the first contact structure corresponds to the second contact structure,
wherein the first contact structure comprises a planar portion, the second contact structure comprises a plurality of elastic units, and the elastic units elastically abut the planar portion.

14. An electronic device with a connector structure, comprising:
a first circuit board;
a first connector, disposed on the first circuit board;
a first shielding cover, disposed on the first circuit board and surrounding the first connector;
a second circuit board;
a second connector, disposed on the second circuit board, wherein the second connector is connected to the first connector; and
a second shielding cover, disposed on the second circuit board and surrounding the second connector, wherein the first shielding cover is electrically connected to the second shielding cover,
wherein the first shielding cover comprises a first surrounding wall and a first contact structure, the first contact structure is connected to the first surrounding wall, the first surrounding wall surrounds the first connector, the second shielding cover comprises a second surrounding wall and a second contact structure, the second contact structure is connected to the second surrounding wall, the second surrounding wall surrounds the second connector, and the first contact structure corresponds to the second contact structure,
wherein the first contact structure comprises a first planar portion and at least one first bent portion, the first bent portion is connected to the first planar portion, the first bent portion and the first planar portion are not coplanar, the first bent portion abuts the second contact structure, and the first bent portion is bent toward the second shielding cover.

\* \* \* \* \*